US008527972B2

(12) United States Patent
Shimura

(10) Patent No.: US 8,527,972 B2
(45) Date of Patent: Sep. 3, 2013

(54) METHOD FOR FORMING A PARALLEL PROCESSING SYSTEM

(75) Inventor: Hiroshi Shimura, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 1 day.

(21) Appl. No.: 13/053,835

(22) Filed: Mar. 22, 2011

(65) Prior Publication Data

US 2011/0197047 A1    Aug. 11, 2011

Related U.S. Application Data

(63) Continuation of application No. 10/562,767, filed as application No. PCT/JP2004/009000 on Jun. 25, 2004, now abandoned.

(30) Foreign Application Priority Data

Jun. 27, 2003  (JP) .................................. 2003-185481

(51) Int. Cl.
    *G06F 9/45*        (2006.01)
(52) U.S. Cl.
    USPC .......................................... 717/149; 717/140
(58) Field of Classification Search
    USPC ............. 717/124, 135, 140, 149; 703/13–16, 703/20–22
    See application file for complete search history.

(56) References Cited

U.S. PATENT DOCUMENTS

| | | | |
|---|---|---|---|
| 5,933,642 A * | 8/1999 | Greenbaum et al. .......... | 717/140 |
| 6,226,776 B1 | 5/2001 | Panchul et al. | |
| 6,625,797 B1 | 9/2003 | Edwards et al. | |
| 6,631,391 B1 | 10/2003 | Inabata et al. | |
| 6,983,456 B2 | 1/2006 | Poznanovic et al. | |
| 6,988,192 B2 | 1/2006 | Snider | |
| 7,000,213 B2 | 2/2006 | Banerjee et al. | |
| 7,039,233 B2 | 5/2006 | Mori et al. | |
| 2002/0124238 A1 | 9/2002 | Metzgen | |

(Continued)

FOREIGN PATENT DOCUMENTS

| CA | 2 448 549 | 11/2002 |
|---|---|---|
| EP | 1 416 388 | 5/2004 |

OTHER PUBLICATIONS

Yamauchi et al., "SOP: A Reconfigurable Massively Parallel System and Its Control-Data-Flow based Compiling Method," 1996, IEEE, p. 148-156.*

(Continued)

*Primary Examiner* — Qing Chen
(74) *Attorney, Agent, or Firm* — Marshall, Gerstein & Borun LLP; Randall G. Rueth

(57) ABSTRACT

A definition file includes a plurality of parallel descriptions that respectively define a plurality of parallel processes performed independently. The parallel descriptions include a first parallel description showing a first parallel process with a plurality of data inputs including a data input into which output data of another parallel process is inputted, with data with the same latency from input in a parallel processing system are inputted into the data inputs. A forming method includes a step of generating hardware configuration information including circuit configurations for executing the parallel processes that include at least one of the plurality of types of elements; and a second step of adding a delay element to the hardware configuration information so that data with a same latency from input into the parallel processing system are inputted into the plurality of data inputs of the circuit configuration for executing the first parallel process.

9 Claims, 11 Drawing Sheets

(56) References Cited

U.S. PATENT DOCUMENTS

| | | |
|---|---|---|
| 2002/0181765 A1 | 12/2002 | Mori et al. |
| 2003/0037321 A1 | 2/2003 | Bowen |
| 2003/0154466 A1 | 8/2003 | Snider |
| 2004/0088685 A1 | 5/2004 | Poznanovic et al. |
| 2004/0261058 A1 | 12/2004 | Kundert |

OTHER PUBLICATIONS

Sueyoshi, "Reconfigurable Computing System no Genjo to Kadai - Computer Evoliution e Mukete-," *The Institute of Electronics*, 96:111-118 (1996).

International Search Report for PCT/JP2004/009000 dated Aug. 31, 2004.

International Preliminary Report on Patentability for PCT/JP2004/009000 dated May 1, 2006.

Written Opinion for PCT/JP2004/009000 dated May 1, 2006.

Cronquist et al., "Architecture Design of Reconfigurable Pipelined Datapaths," *IEEE Comput. Soc.*, Sec. 1 and 2.1, pp. 23-40 (1999).

Cronquist et al., "Specifying and Compiling applications for RaPiD," *IEEE Comput. Soc.*, Secs. 3 and 4, pp. 116-125 (1998).

Babb et al., "The Raw Benchmark Suite: Comutation Structures for General Purpose Computing," *IEEE J. Comp. Soc.*, Sec. 3.1, pp. 134-143 (1997).

Hauser et al., "GarpL A MIPS Processor with a Reconfigurable Coprocessor," *IEEE Comput. Soc.*, pp. 24-33 (1997).

Chen et al., "A Reconfigurable Multiprocessor IC for Rapid Prototyping of Algorithmic-Specific High-Speed DSP Data Paths," *IEEE J. Solid-State Circuits*, 27:1895-1904 (1992).

Chen et al., "An Integrated System for Rapid Prototyping of High Performance Algoritm Specific Data Paths," *IEEE Comput. Soc.*, Abstract:134-148 (1992).

Mirsky et al., "A Reconfigurable Computing Architecture with Configurable Instruction Distribution and Deployable Resources," *IEEE Comput. Soc.*, Sec. 2.2:157-166 (1996).

Singh et al., "MorphoSys: An Integrated Reconfigurable System for Data-Parallel and Computation-Intensive Applications," *IEEE Transactions on Computers*, 49:465-474 (2000).

Hauck et al., "Reconfigurable Computing: A Survey of Systems and Software," *ACM Computing Surveys*, 34:171-210 (2002).

Supplementary European Search Report for European patent application No. 04746469.8-2224 dated Aug. 10, 2006.

Lee et al., "A Parallel and Accelerated Circuit Simulator with Precise Accuracy," *IEEE Comput. Soc.*, pp. 213-218 (2002).

\* cited by examiner

Fig. 10

```
%{
        extern int input[] ;
        extern int output[] ;
%}
#include "sz1200.dih"
uint32 max(EID eid,  cuint32 numOfData, stream uint32 in)
{
        uint32 counter = 1;     }11l
        uint32 a = 0;

a = a < in ? in : a;
        counter = counter + 1;
        counter.valid = in. valid;
        return counter == numOfData ? a  :  INVALID;
}
st(EID_FLOW_0, 0, "output", 4, 1)
        = max(EID_FLOW_0, ld(EID_FLOW_0, 0, "input", 0x400,  0x100));
```

10e

METHOD FOR FORMING A PARALLEL PROCESSING SYSTEM

TECHNICAL FIELD

The present invention relates to designing a parallel processing system and in particular to a method and apparatus that generate hardware configuration information for a parallel processing system based on a definition file and to a method of simulating a parallel processing system based on a definition file.

BACKGROUND ART

A number of types of languages are used when designing LSIs and ASICs. High-level languages such as "C" that have a high degree of abstraction are languages on a procedural level and are suited to showing how an entire process is executed in order on an instruction-by-instruction basis. Description on this level normally has no hardware dependency, is composed of application programs that can be received by a suitable computer, and is normally used to describe the specification of an LSI or an entire process executed by an LSI. Hardware description languages (HDL) such as Verilog-HDL or VHDL are also referred to as RTL and are used to describe, on a register transfer level, paths of special-purpose hardware for executing special-purpose instructions and/or a sequence for driving such data paths.

An algorithm is defined as a group of a limited number of rules that are precisely defined to solve a problem and are performed with a given order. In conventional parallel processing, among an entire process (application) described by an algorithm proceeds to be performed in an order, some parts (processes) that can be independently executed are performed in parallel to reduce the processing time. When an application is executed by a system including hardware resources that are suited to parallel processing in advance, the parts that can be processed in parallel are converted to parallel processes by a compiler in an attempt to improve the execution speed.

Also, when hardware is designed with the object of executing a dedicated application, a circuit is designed so as to process the parts in parallel, if the parts can be independently executed, with the aim of reducing the processing time. A technology disclosed by Japanese Laid-Open Patent Publication No. H10-116302 is a method of designing a circuit for a process where the execution time is uncertain using HDL with parallel processing and synchronized communication. In the synchronized communication, when two functions are executed in parallel, receiver process included in the two functions waits until the transmitter side can prepare, then the process proceeds after communication is completed. Accordingly, even though the functions are described in parallel, the functions are not carried out independently and therefore the execution time of the processing varies. On the other hand, processes that do not require synchronized communication are performed independently as parallel processes. These are technologies with an object of reducing the number of execution cycles by executing processes, out of the entire process provided in the source language, that are written so as to be executed in parallel on a source program, so as to be executed in parallel or with using synchronized communication in the hardware design.

In recent years, hardware for enabling parts of circuits constructing LSIs reconfigurable by software has been provided. International Publication WO03/007155 discloses a technology that includes the fundamental units for reconfiguring of operation unit level, not a gate level, that are equipped with arithmetic and/or logical functions of a certain scale, such as ALUs, and disposes a plurality of types of operation units in a matrix so that the time required by reconfiguration can be reduced. Since the operation units in such a system where a plurality of operation units are disposed in a matrix are respectively capable of executing processes in parallel, the system can be thought of as having hardware resources suited to a huge number of parallel processes. However, a design system suited to designing a system that is suited to this type of parallel processing has not been provided.

High-level languages such as "C" that are suited to software design have a premise of processing an algorithm with the rules included in the algorithm in a temporal order or in a time sequential. Accordingly, a configuration is used where instructions are sequentially executed as a program counter advances, with it being difficult to introduce parallel concepts that are not sequential. Even if the describing of instructions in parallel is permitted, this is limited to spatially expanding processes that can be independently executed in parallel within a range where the temporal order is not violated, and it is not Possible to aggressively use hardware resources suited to parallel processing. In addition, since instructions that do not depend on hardware are described in a high-level language, it is unclear at what timing instructions described in parallel will actually start and end on the hardware. Accordingly, even if the hardware space for processing is spatially expanded, the designer will not be able to define or even grasp what kind of parallel processing is actually carried out on the hardware.

Since HDL describes circuit arrangements that operate independently, it is fundamentally able to describe parallel processing. Also, since it is clear what the hardware is, it will be possible to investigate and adjust the timing at which processing is executed. For this reason, it is possible to write HDL descriptions that will realize an algorithm given in a high-level language. However, since HDL description is written with the premise of specific hardware, there is no general-purpose applicability, and it is not possible to realize the same algorithm on different hardware. In addition, if the hardware for which the HDL description has been written is not known, it will not be possible to understand the algorithm included in that HDL description.

At the level of microprograms obtained as a result of compiling high-level language for specific or particular hardware, there are technologies such as VLIW where instructions that can be executed completely independently are written in parallel and superscalar techniques where a plurality of instructions are simultaneously fetched and instructions that can be executed in parallel are found. These technologies improve the execution speed by executing processes, out of the processes that are arranged in temporal order, which can be performed spatially in parallel on a plurality of pipelines provided for executing such processes, and are no different to high-level languages in that a part of process where the temporal order is not violated is spatially expanded. That is, microprograms themselves are programming language and therefore sequential processing where instructions are executed in order as a program counter advances is also required for the VLIW and superscalar technologies. In addition, microprograms have a premise of special-purpose hardware and lack general-purpose applicability in the same way as HDL.

In this way, out of programming languages that are executed as a program counter advances, high-level languages have general-purpose applicability and facilitate software design, but the parts that can be spreading to parallel processing are limited to processes that can be executed independently of the program counter advancing, and it is difficult to effectively use operation units suited to a large number of parallel processes. Also, for high-level languages that do not depend on hardware, the timing of parallel processing is not known, and therefore a design that effectively executes an application by using a large number of operation units disposed in a matrix in parallel is not possible. Although it is possible to describe parallel processing in HDL, even if an algorithm is described in HDL, it is only possible to describe an algorithm with a premise of specific hardware, and therefore knowledge of the specific or particular hardware is required. It is not easy for a software technician to understand the functions, input and output timing, and the like of many types of operation units disposed in a matrix for designing an application in HDL.

DISCLOSURE OF THE INVENTION

In the present invention, there is provided a definition file that includes a plurality of parallel descriptions that respectively define a plurality of parallel processes performed independently and in synchronization by a system including a plurality of elements that operate in parallel. The plurality of parallel descriptions include a first parallel description showing a first parallel process with a plurality of data inputs including at least one data input into which output data of another parallel process is inputted, with data with the same latency from input in the system being inputted into the plurality of data inputs. In this definition file, using descriptions with no hardware dependency, it is possible to define an algorithm in a state where a program counter is not required. That is, according to the definition file, although the parallel descriptions resemble a conventional high-level language, by the parallel descriptions with no temporal order, it is possible to describe an order included in an algorithm spatially and not temporally.

The definition file defines a procedure of a job (application) to be processed; such an aspect is common to a program with conventional language. However, as a general rule, statements of programming language are written so that stated instructions to a computer are executed in order from the start, that is, together with the passage of time. Accordingly, to execute an algorithm defined by a programming language, it is necessary to provide controls according to a program counter showing the order of the instructions to be executed. Since the instructions written in the program are executed in order according to the program counter, when an instruction that includes a variable is executed, the state of the variable will be unambiguously determined by instructions performed before that instruction in time. Accordingly, the defined algorithm is properly executed and there are no cases where execution is not possible.

The definition file of the present invention includes a plurality of parallel descriptions that respectively define a plurality of parallel processes that are performed independently and in synchronization. Accordingly, to execute the parallel processing defined by the definition file of the present invention, a program counter showing a temporal order is not required. In addition, in the definition file, an algorithm can be defined by including a parallel description showing or indicating a parallel process into which output data the other parallel process is inputted. However, in parallel descriptions with variables, if the course or history of variables is not unambiguously determined, there is the possibility that the algorithm will not be executed as intended. In a first parallel description showing a first parallel process including a plurality of data inputs, by understanding that data with a same latency from input into the system is inputted into the plurality of data inputs, variables are prevented from becoming unstable or uncertain. Accordingly, in the definition file, variables are unambiguously determined for each parallel description and therefore the algorithm can be correctly defined by the parallel descriptions. Also, in the definition file, the parallel processes according to the parallel descriptions are processes to be executed completely independently, the algorithm can be correctly described without extra processing such as synchronized communication and without solving timing problems with specifying hardware.

In the present specification, the expression "the inputted data have the same latency" means that the inputted data are data (data groups) that are loaded together into the system at the same time (synchronously) or data (data groups) that were loaded in synchronization and then processed by one or a plurality of parallel processes. That is, data with the same or identical latency are data inputted into the system at the same timing or data produced by such data being processed by the other parallel process.

The definition file of the present invention includes a plurality of parallel descriptions, such an aspect is common to HDL, and therefore a program counter is not required to execute parallel processes according to the plurality of parallel descriptions. Accordingly, the definition file can be said to describe hardware. In addition, the definition file includes a parallel description showing a parallel process with a data input in which output data of another parallel process is inputted, and when there are a plurality of data inputs, the data inputted into such data inputs are determined unambiguously. Therefore, according to the present invention, it is possible to provide a hardware description language that can define an algorithm correctly and understandably to the user. Additionally, even if the hardware is not understood in detail, the data are unambiguously inputted into the respective parallel processes, and therefore it is not necessary to have detailed information or knowledge of the hardware that actually performs the parallel processes. Accordingly, the definition file of the present invention is not dependent on the actual hardware and can describe hardware without a premise of specific hardware. For this reason, the definition file is an extremely general-purpose hardware description language that is hardware independent. Therefore, the definition file is a tool or description suited to allowing a software technician to easily design or generate an LSI or ASIC, and in particular, an LSI or ASIC including a large number of parallel processing elements.

In addition, when the plurality of parallel descriptions included in the definition file of the present invention are aligned in order of the latency of the data inputted therein, the plurality of parallel descriptions will be aligned in order of the time passing or history of the variables from inputting therein. In this state, the definition file has an aspect that is common to a program in which instructions are aligned in the order of execution. Accordingly, a software technician can produce a definition file of the present invention with the same feeling as when producing a normal program. For this reason also, the definition file is a tool extremely suited to having a software technician easily design and produce an LSI or ASIC. Also, according to the definition file of the present invention, it is possible to spatially lay out an algorithm using a plurality of elements capable of parallel processing, and therefore an application can be executed at high speed by effectively utilizing a system including a large number of elements that operate in parallel.

In the definition file of the present invention, for each parallel description, the latency of the input data should be the same, and the timing is adjusted. Accordingly, when hardware is formed according to a definition file, it is necessary to adjust the timing of the input data in units of parallel processes defined by the parallel descriptions. The elements for executing the parallel processes may be operation units that perform operations in bit units. In a parallel processing system where operation units with a certain degree of operation functioning, such as ALUs, are disposed in a matrix, it is possible to execute the parallel processes by mapping the parallel descriptions to one or a plurality of the operation units. To adjust the timing in units of the parallel descriptions, it is sufficient to add operation units for delaying, and therefore the definition file of the present invention is suited to describing a parallel processing system where a plurality of types of operation units are connected to realize a hardware configuration suited to an application. This means that by using the definition file of the present invention, it is possible to efficiently design and develop a parallel processing system, and also to simulate the same.

The definition file of the present invention can be provided having been recorded on a computer-readable recording medium, and based on the definition file, by using a computer, it is possible to form a parallel processing system including a plurality of types of elements that operate in parallel. That is, the plurality of parallel descriptions in the definition file include a first parallel description indicating a first parallel process with a plurality of data inputs including at least one data input into which output data of another parallel process is inputted. By using a method for forming including a first step of generating, in accordance with the definition file and based on a hardware library in which information on the plurality of types of elements is stored, hardware configuration information including circuit configurations (a hardware configuration) for executing the parallel processes defined by the parallel descriptions of the definition file and a second step of adding a delay element to the hardware configuration information so that data with a same latency from input into the parallel processing system are inputted into the plurality of data inputs of the circuit configuration for executing a first parallel process, it is possible to generate information for configuring hardware in which an algorithm defined by the definition file is spatially laid out using a plurality of types of elements and therefore possible to form a parallel processing system that executes an application.

The time (the number of cycles) consumed by elements of the respective types can be known from the hardware library in which information related to specific hardware is stored. When a parallel process has a plurality of data inputs, by referring to the hardware library, it is possible to add a delay element suit to specific or specified hardware premised so that the latency of the data inputted into the plurality of data inputs have the same latency, and to correctly map the algorithm defined by a definition file to the specific hardware. When the hardware is such that the plurality of elements execute processing in synchronization with a clock, information on the number of cycles consumed by each of the plurality of types of elements is stored in the hardware library, and in the second step, a delay element corresponding to a number of cycles consumed by at least one of the plurality of types of elements is added.

A parallel processing system may be with a fixed hardware configuration. The parallel processing system alternatively may be reconfigurable into different hardware configuration by changing the connections between a plurality of types of elements. For a reconfigurable parallel processing system, hardware configuration information including information showing a plurality of different hardware configurations is generated.

The method for forming a parallel processing system can be provided with an apparatus, for example, a compiler, that arranges a system including a plurality of types of elements that operate in parallel. This compiler is an apparatus for forming, in accordance with a definition file, a parallel processing system including a plurality of types of elements that operate in parallel, the apparatus including a first means for generating, based on a hardware library in which information on the plurality of types of elements is stored, hardware configuration information including circuit configurations for executing the parallel processes defined by the parallel descriptions of the definition file, the circuit configurations including at least one of the plurality of types of elements, and a second means for adding a delay element to the hardware configuration information so that data with a same latency from input into the parallel processing system are inputted into the plurality of data inputs of the circuit configuration for executing a first parallel process. In addition, a program or program product for realizing this process for designing a parallel system on a computer equipped with suitable resources can be recorded onto a recording medium or provided using a computer network. The program for designing the parallel processing system includes instructions that can cause a computer to execute a process including the first step and the second step described above.

The definition file of the present invention is suited to forming or generating a parallel processing system including a plurality of types of operation units where the plurality of types of operation units are of a scale that enables one parallel process to be process by one operation unit. Accordingly, in the hardware library, it is preferable to provide information on the plurality of types of operation units that have a scale whereby one parallel process is processed by one operation unit. The plurality of types of elements may operate in bit units. However, the parallel processes described in the definition file are normally data processing in byte or word units. Accordingly, it is preferable for information on a plurality of types of operation units that can execute different operations in byte or word units to be prepared in the hardware library and for a parallel processing system in which a plurality of operation units are disposed to be generated.

For a parallel processing system providing with a plurality of types of operation units disposed in a matrix and changing the configuration of a network or circuit wiring that connects such operation units to reconfigure different hardware configurations, hardware configuration information including information showing a plurality of different hardware configurations suited to executing a content of the definition file can be generated using a compiler or a program for a compiler.

Forming a parallel processing system according to the definition file may include a variety of optimizations. When the plurality of parallel descriptions include a second parallel description that defines a second parallel process including shared processing that is common to at least part of a third parallel process defined by a third parallel description, in the first step, a shared circuit configuration including at least one of the plurality of types of elements can be generated for the shared processing, and, in such case, in the second step, a delay element is added to a circuit configuration for executing a difference between the second parallel process and the shared processing as the circuit configuration for executing the first parallel process. The circuit configuration for executing the difference between the second parallel process and the shared processing usually becomes a configuration with a plurality of data inputs like that of the first parallel process. By the above, the consumption of hardware resources such as elements and wiring for connecting the elements used to arrange the circuit can be suppressed.

One of the plurality of types of operation units for the parallel processing system may include means for changing its process according to an input from the outside. Correspondingly to this, the plurality of parallel descriptions should preferably include a parallel description describing parallel process where the processing content changes according to an input from the outside. It is possible to design a parallel processing system where the processing content can be'changed even if the network or circuit wiring does not change. It is also possible to change the processing content of operation units together with the network or the circuit wiring, so that a reconfigurable parallel processing system can be designed even more flexibly.

Based on a definition file of the present invention, it is possible to simulate a system including a plurality of types of elements that operate in parallel. A method of simulating and simulator for a system including a plurality of types of elements that operate in parallel based on a definition file include a step of executing or means for executing a plurality of parallel processes included in the definition file, when executing a parallel description with a plurality of input data, data with a same latency from input into the system are used as the plurality of input data. The present invention also provides a program or program product for causing a computer to simulate a system including a plurality of types of elements that operate in parallel based on a definition file, with the program being recorded onto a suitable recording medium such as a CD-ROM or being provided via a computer network.

BRIEF DESCRIPTION OF THE DRAWINGS

FIG. 10 shows a different example of DIDL.

BEST MODE FOR CARRYING OUT THE INVENTION

Figure 1:
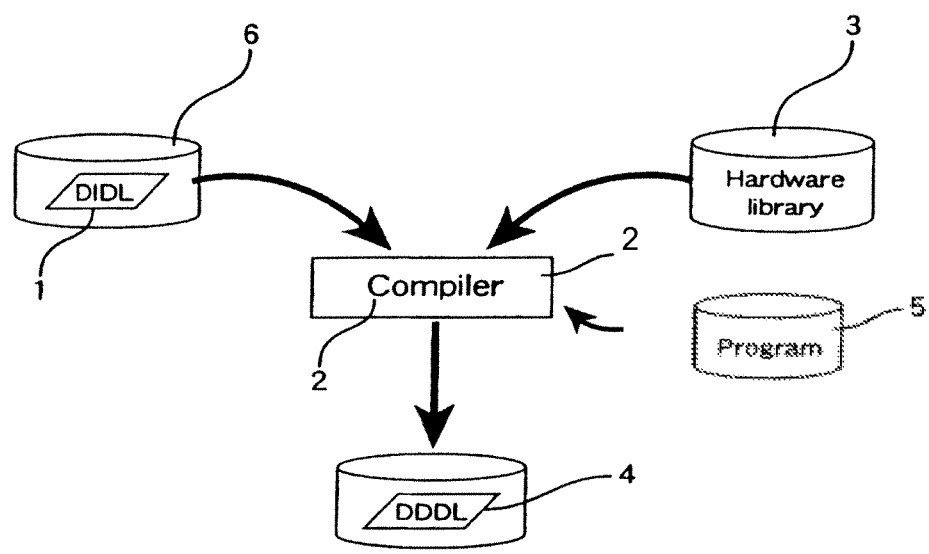
FIG. 1 shows an outline of configuration for generating DDDL, which is hardware configuration information, from DIDL that is a definition file.

FIG. 1 shows an outline of procedure for designing hardware using a definition file included in the present invention. A definition file 1 is called DIDL (Device Independent Description Language), and is converted by a compiler 2, which refers to information in a hardware library 3, to hardware configuration information 4 that uses the hardware information stored in the library 3. The hardware configuration information 4 is called DDDL (Device Dependent Description Language). The compiler 2 is realized using a general-purpose computer 9 equipped with suitable hardware resources and functions as a compiler by installing a program 5 for parallel system designing that interprets the DIDL 1 and generates the DDDL 4. The DIDL 1 is provided by storing on a computer-readable recording medium 6, such as a CD-ROM or a magnetic disk. The DIDL 1 is also provided via communication such as a computer network like the Internet, with the provided DIDL 1 being used having been recorded on a suitable recording medium that composes part of the computer 9.

Figure 2:
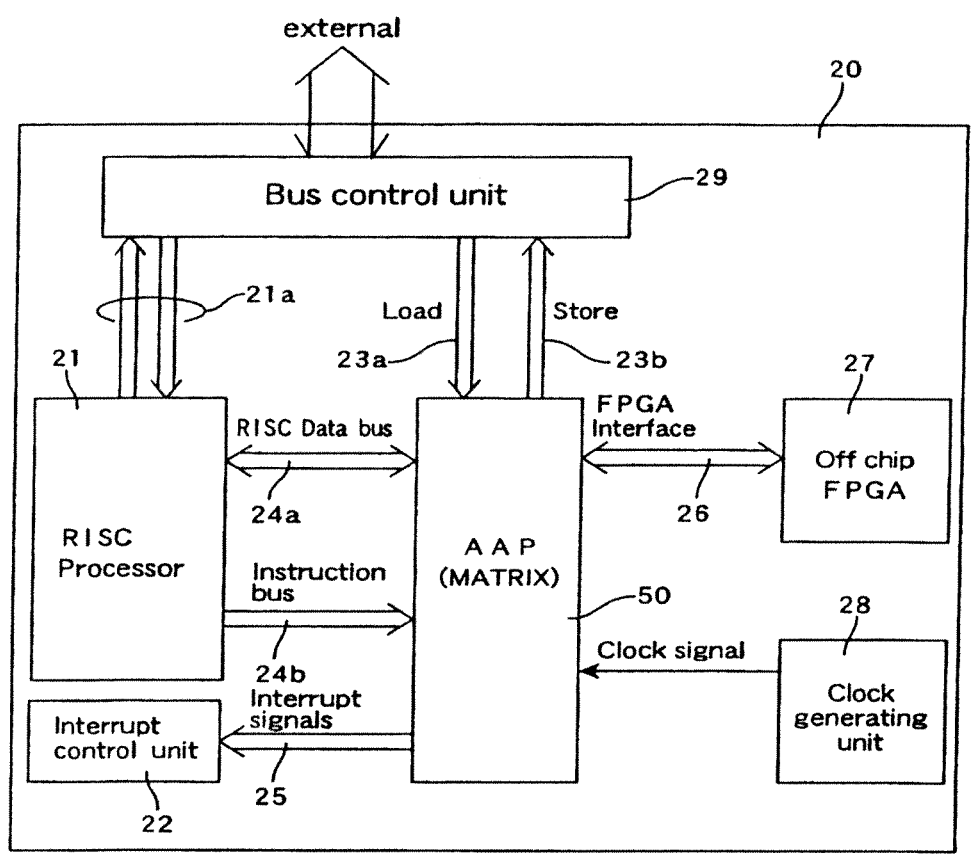
FIG. 2 schematically shows a reconfigurable parallel processing system.

FIG. 2 shows one example of a processor equipped with a parallel processing system. This processor is a Reconfigurable Processor (hereinafter RP) disclosed by International Publication WO03/007155 that was filed by the present applicant. The RP 20 includes: a basic processor 21 with a general-purpose configuration that carries out general-purpose processing including error handling based on an instruction set provided by a program or the like; an AAP (Adaptive Application Processor) 50 in which one or a plurality of data paths (that are called sometime data flows or virtual data flows) that are suited to specific or special-purpose data processing are variably formed using arithmetic and/or logical operation elements disposed in a matrix; an interrupt control unit 22 that controls interrupt processing to the AAP 50; a clock generating section 28 that supplies an operation clock signal to the AAP 50; an FPGA unit 27 for further improving the flexibility of the operation circuits that can be provided by the RP 20; and a bus control unit 29 that controls inputs and outputs of data to and from the periphery. The basic processor 21 and the AAP 50 are connected via a data bus 24a that can exchange data between the basic processor 21 and the AAP 50 and an instruction bus 24b for controlling the configuration and operation of the AAP 50 from the basic processor 21. Also, an interrupt signal is supplied from the AAP 50 to the interrupt control unit 22 via a signal line 25 so that when the processing of the AAP 50 ends or an error occurs during processing, the state of the AAP 50 can be fed back to the basic processor 21.

The AAP 50 and the FPGA 27 are connected by a data bus 26 so that data is supplied from the AAP 50 to the FPGA 27, processing is carried out, then the processing result is returned to the AAP 50. The AAP 50 is also connected to the bus control unit 29 by a load bus 23a and a store bus 23b so that data can be exchanged between the AAP 50 and an external data bus to the RP 20. The basic processor 21 is also connected to the bus control unit 29 via a bus 21a and can therefore exchange data with the external data bus.

Figure 3:
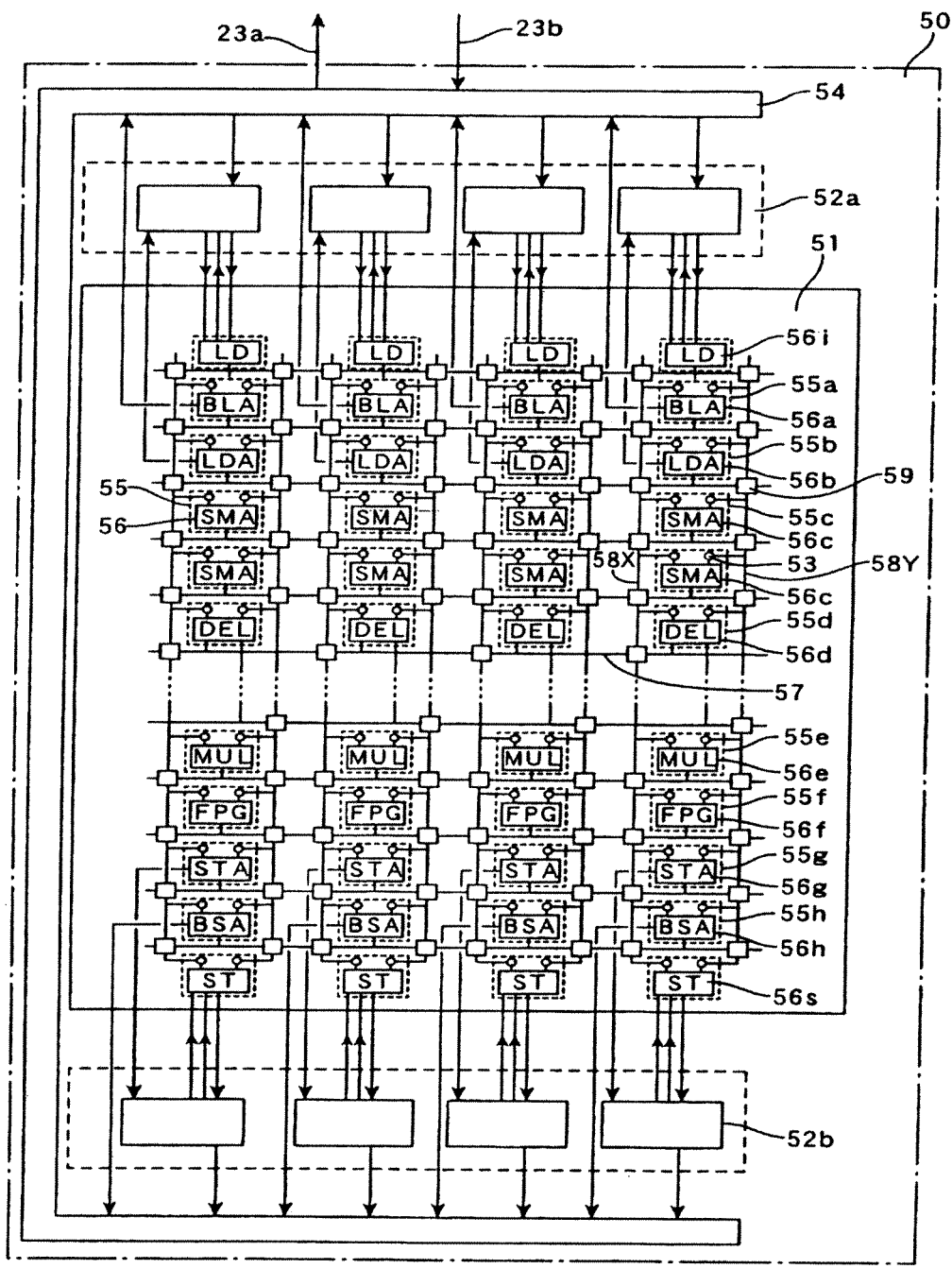
FIG. 3 shows a parallel processing system where a plurality of elements that operate independently in parallel are disposed in a matrix.

FIG. 3 schematically shows the AAP 50. The AAP 50 includes a matrix unit 51 in which a plurality of logic elements (logic blocks or logic units (hereinafter referred to as "elements") that perform arithmetic and/or logical operations are disposed in a matrix, an input buffer 52a that supplies data to the matrix unit 51, and an output buffer 52b that stores data outputted from the matrix unit 51. The input buffer 52a and the output buffer 52b are respectively composed of four small-capacity input buffers, and are connected to the input and output buses 23a and 23b via an access arbitration unit 54.

This matrix unit 51 is a kernel integrated circuit part of a parallel processing system in which data paths and data flows can be reconfigured, and has elements 55, which are a plurality of types of operation units that operate in parallel, arranged in an array or matrix to construct four lines in the vertical direction. Information on the plurality of types of elements included in the matrix 51 is stored in the hardware library 3. Between the elements 55, the matrix unit 51 includes row wire sets 57 that extend in the horizontal direction and column wire sets 58 that extend in the vertical direction. The respective column wire sets 58 are composed of a pair of wire sets 58x and 58y disposed on the left and right respectively of the operation units 55 aligned in the column direction. Switching units 59 are disposed at intersections of the row wire sets 57 and the column wire sets 58 and are capable of selecting and connecting any channel included in the row wire sets 57 to any channel included in the column wire sets 58. The switching units 59 each include a configuration RAM that stores settings, and by rewriting the content of the configuration RAM according to data supplied from the processor unit 21, it is possible to freely and dynamically control the connections between the row wire sets 57 and the column wire sets 58. In the matrix unit 51, it is possible to freely and dynamically change the configuration of data flows formed by connecting all or a part of the plurality of elements 55 using the wire sets 57 and 58.

In the RP 20, these elements 55 operate in parallel, and information of the function, delay, conditions for input/output data, and the like of the various types of elements 55 are stored in the hardware library 3. These elements 55 operate in synchronization with the clock signal supplied from a clock generating unit 28, with the number of cycles (the number of clocks) consumed depending on the element type and the processing executed inside the respective elements. The number of cycles consumed by processing input data and then outputting is stored in the hardware library 3 as delay information for the respective types of elements. The arrangement of the various types of elements 55, and information on the wire sets 57 and 58 and the switching units 59 are also stored in the hardware library 3 and connection information for the elements 55 (a data flow configuration) for realizing the algorithm defined by the DIDL 1 is generated from the compiler 2 as the hardware configuration information (DDDL) 4. This means that by controlling the matrix unit 51 so that the elements 55 are connected by the wire sets 57 and 58 according to the DDDL 4, it is possible to spatially lay out or map the algorithm defined by the DIDL 1 using the elements 55 of the matrix unit 51.

The respective elements 55 include a pair of selectors 53 for selecting the input data from one pair of column wire sets 58x and 58y, and an internal data path unit 56 that performs specific arithmetic and/or logic operation processing on the selected input data and outputs a result to the row wire sets 57 as output data. The elements 55 are disposed in the matrix unit 51 so that elements 55 of different types including internal data path units 56 for executing different process are aligned on different rows. For example, the elements 55 disposed on the first row include data path units (LD) 56i suited to processing that receives data from the input buffer 52a. The elements 55a disposed on the second row are elements for writing data from an external device into the input buffer 52a and include data path units (BLA) 56a equipped with internal data paths suited to generating an address for a block load. For all of the elements 55 that construct the matrix unit 51, the configuration of the internal data path and/or initial values thereof can be changed to a certain extent. Such settings are designated by control signals sent from the basic processor 21 via the control bus 24b into the configuration RAM of each element 55.

The elements 55b disposed on the third row include internal data path units (LDA) 56b that generate input read addresses for loading desired data from respective input RAMs into the matrix unit 51. The elements 55c disposed on the fourth and fifth rows include data path units (SMA) 56c suited to arithmetic operations and logic operations. A data path unit 56c includes a shift unit, a masking unit, a logic operation unit (ALU) and configuration RAM for setting these units for performing specific operation. According to an instruction written by the processor 21, adding or subtracting, a comparison, a logical AND or a logical OR on the data inputted into the matrix unit 51 can be performed by the elements, with the result being outputted as an output signal of elements 55.

The elements 55d disposed on the next row down include data path units (DEL) 56d suited to processing that delays the timing at which data is transferred. The elements 55e disposed on a further row down include data path units (MUL) 56e that are equipped with a multiplier or the like and are suited to multiplication processing. As yet different elements 55f, elements including data path units 56f as interfaces with the FPGA 27 provided outside the matrix unit 51 are also included, so that data can be supplied to the FPGA 27, processed therein, and then returned to the matrix unit 51 and subjected to further processing.

Elements 55g and 55h that are respectively provided with data path units 56g and 56h suited to generating addresses for store operations are also disposed in the matrix unit 51 that is a reconfigurable semiconductor circuit block. These elements perform control to output data to an external device via the output buffer 52b. Finally, elements 55 provided with data path units (ST) 56s suited to outputting data to be stored are disposed on the lowest level. Accordingly, by dynamically changing the connections of the elements 55, it is possible to flexibly configure a variety of data flows on the matrix unit 51, and therefore a variety of processing can be performed.

Figure 4:
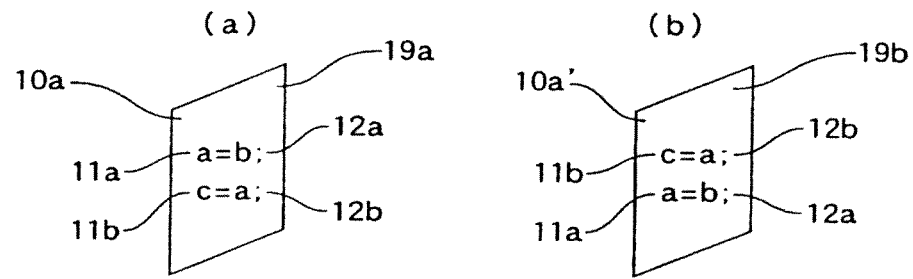
FIG. 4(a) shows an example of DIDL.
FIG. 4(b) shows a different example of DIDL.

FIG. 4(a) and FIG. 4(b) show simple examples of the DIDL. The DIDL 10a shown in FIG. 4(a) includes parallel descriptions 11a and 11b on two rows. The parallel description 11a defines a process 12a that substitutes a variable "b" into a variable "a". Similarly, the parallel description 11b defines a process 12b that substitutes the variable "a" into a variable "c". Accordingly, the process 12b has the output data of another process, i.e., the process 12a, as a data input. In the DIDL 10a, these processes 12a and 12b are parallel processes that are independently carried out in synchronization by elements that operate in parallel, with the DIDL 10a showing a hardware configuration that can independently carry out the parallel processes 12a and 12b in synchronization. In the hardware defined by the DIDL 10a, if the variables (a, b, c) are (1, 2, 3) in a given cycle t0, the variables will become (2, 2, 1) in the next cycle t1.

On the other hand, if the description of the DIDL 10a is understood to be a program 19a, the variable "c" will become 2, and therefore the obtained result will differ. However, with the hardware defined by the DIDL 10a, in the cycle t2 that follows the cycle t1, the variables (a, b, c) will become (2, 2, 2), and therefore the same result is obtained as when the description of the DIDL 10a is understood to be the program 19a.

In the DIDL 10a' shown in FIG. 4(b), the order of the parallel descriptions 11a and 11b is interchanged, but since the processes 12a and 12b corresponding to the respective descriptions are performed independently, the operation results of the respective cycles t0 to t2 do not change. On the other hand, if the descriptions in FIG. 4(b) are understood to be a program 19b, the order of the processes 12a and 12b will be interchanged, and therefore variables (a, b, c) will become (2, 2, 1). That is, the results of the program in which the processes have been interchanged match the values in the cycle t1 of the DIDL 10a or 10b.

In this way, it is possible to describe hardware that realizes the algorithm of either of the programs 19a and 19b using the DIDL 10a, however, the cycle in which the same result is obtained differs between the programs 19a and 19b. For this reason, with the present invention, the DIDL 10a is a definition file that can maps an algorithm in the parallel system using parallel descriptions showing a parallel process where output data of at least one other parallel process is used as at least one data input. In addition, in a parallel description (a first parallel description) showing a parallel process (a first parallel process) with a plurality of data inputs, the plurality of data inputs are defined as inputs of data that have same latency from input into the system, that is, the matrix unit 51, thereby making it possible to define a hardware configuration that can operate according to the same algorithm as a program.

Figure 5:
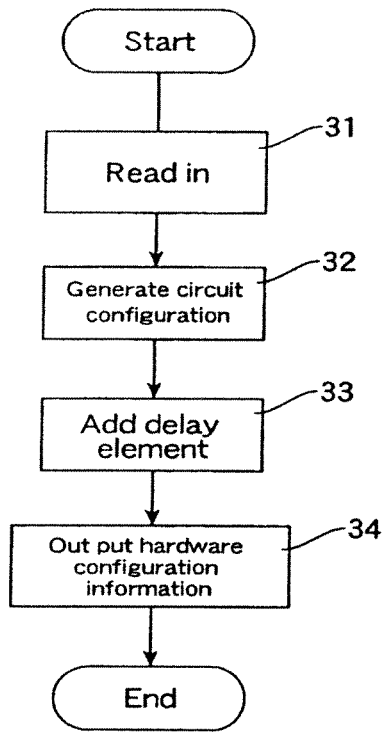
FIG. 5 is a flowchart showing an outline of processing of a compiler.

FIG. 5 schematically shows the processing of the compiler 2 for the DIDL. First, in step 31, the DIDL 1 is read in and then in step 32, parallel descriptions included in the DIDL 1 are interpreted. Based on a hardware configuration stored in the hardware library 3, a circuit configuration for executing the parallel processing shown by the parallel descriptions is generated. To generate the hardware configuration information 4 that performs parallel processing using the matrix unit 51 of the reconfigurable processor shown in FIG. 3, circuit configurations are generated using information about the various types of elements 55 and information about the wire sets 57 and 58 and the switches 59 stored in the hardware library 3 to include the elements 55 and operate in parallel, and the result is stored in a suitable memory of the compiler 2 as the DDDL 4 of the hardware configuration information. Examples of the information on the respective elements 55 include operations and functions, input conditions, and processing cycles. Since the number and arrangement of the elements 55 are fixed in the matrix unit 51, generated hardware information 4 includes the circuit configurations for executing the parallel processes with information on the elements 55 selected for the parallel processes and circuit information on the positions of the elements 55 and wiring routes for connecting the selected elements 55. When a circuit configuration generated in step 32 includes a plurality of data inputs, in step 33, to have data with the same latency from input into the parallel processing system, that is, the matrix unit 51, inputted into the plurality of data inputs, factors of the delay elements 55d provided with the data path units (DEL) 56d are added to the DDDL 4. Accordingly, when the DIDL 1 includes a first parallel description showing a first parallel process with a plurality of data inputs including at least one data input into which output data of another parallel process is inputted, to have data with the same latency from input into the parallel processing system inputted into the plurality of data inputs of the circuit configuration generated in step 32 and including the first parallel processing, in step 33 one or more delay element are added to the DDDL 4 that is the hardware configuration information.

In addition, in steps 32 and 33, a variety of optimizations are carried out. When a parallel process (a second parallel process) defined by a parallel description included in the DIDL 1 includes shared processing that is the same as and common to at least part of a parallel process (a third parallel process) defined by another parallel description, in step 32, a shared circuit configuration including the common elements 55 are mapped for the shared processing, and in step 33, delay elements 55d are added if necessary to the elements 55 not included in the shared configuration, that is, the circuit configuration for executing the difference process between second parallel process and the shared process, to adjust the latency.

Next, in step 34, the DDDL 4 including the circuit configurations generated in steps 32 and 33 and information for connecting the same is outputted. The matrix unit 51 can be reconfigured to a different hardware configuration by changing the connections of the plurality of elements 55. The DDDL 4 is information including a plurality of different hardware configurations, and therefore the matrix unit 51 can be reconfigured by the DDDL 4. These steps can be performed on description by description basis of the parallel descriptions included in the DIDL 1, and it is also possible to perform these steps at once for some or all of the parallel descriptions included in the DIDL 1.

Figure 6:
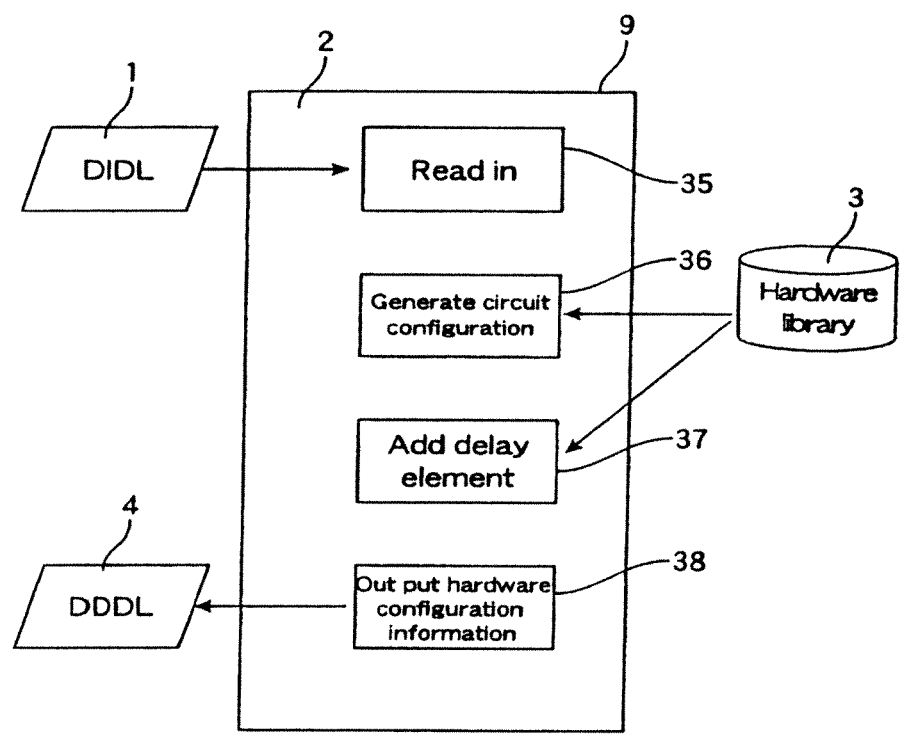
FIG. 6 is a block diagram showing an outline of arrangement of a compiler.

The method for forming a parallel processing system including the steps 31 to 34 is provided and the method can be distributed by a compiler program or program product recorded on a suitable recording medium to cause a general-purpose computer 9 to execute the respective processes of the steps 31 to 34. It is also possible to provide a program product via a network. By installing the program 5 into the general-purpose computer 9, the general-purpose computer can be used as the compiler 2. As shown in FIG. 6, the computer 9 on which the compiler program 5 is installed operates as a compiler 2 including: a function for reading the DIDL 1; a function (a first means) 36 for generating, based on the hardware library 3, a circuit configuration for executing parallel processing described in the DIDL 1; a function (a second means) 37 that adds, when the circuit configuration has a plurality of data inputs, delay elements 55d so that data with matching latency from input into the matrix unit 51 is supplied to the plurality of data inputs; and a function 38 that outputs the generated circuit configuration, including connection information for connections between elements, as the DDDL 4.

Figure 7:
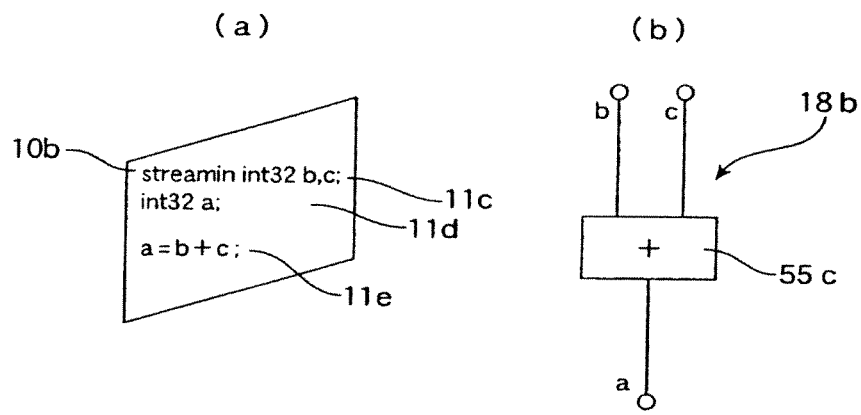
FIG. 7(a) shows an example of DIDL.
FIG. 7(b) shows a circuit configuration corresponding to the DIDL.

In FIG. 7(a), a different example of DIDL is shown. The DIDL 10b includes a description 11c showing variables inputted into the system, i.e., the matrix unit 51 in the present embodiment, a description 11d showing an internal variable, and a description 11e showing an addition. When the DIDL 10b is read into the compiler 2 and processed, as shown in FIG. 7(b), a circuit configuration 18b including an operation element 55c equipped with the data path unit 56c capable of arithmetic operations is generated. In this circuit configuration 18b, the operation element 55c includes two data inputs where the variables "b" and "c" are inputted and a data output that outputs the variable "a".

Figure 8:
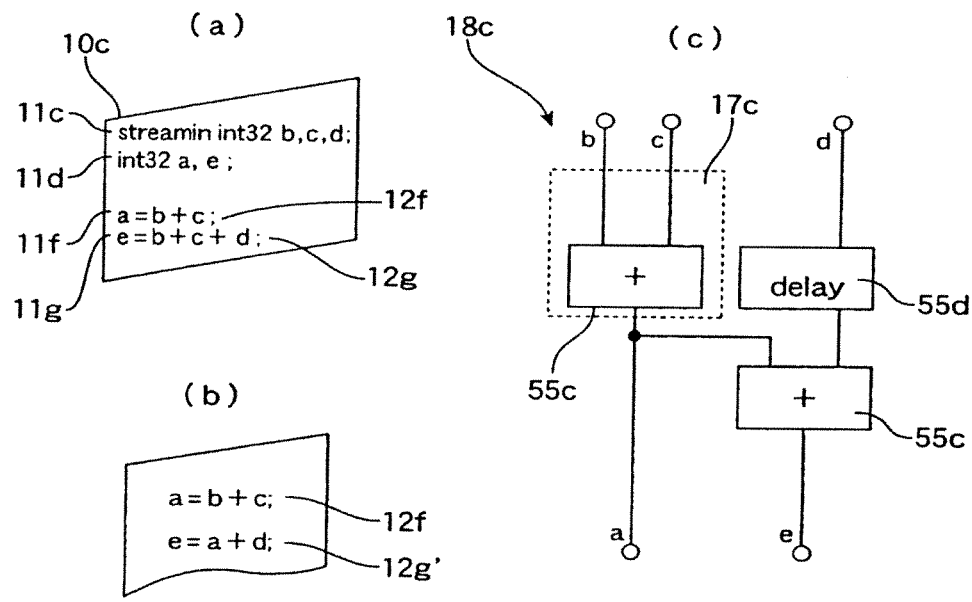
FIG. 8(a) shows a different example of DIDL.
FIG. 8(b) shows an optimized example.
FIG. 8(c) shows a circuit configuration corresponding to the same.

In FIG. 8(a), yet another example of DIDL is shown. This DIDL 10c includes, in addition to descriptions 11c and 11d relating to variables, parallel descriptions 11f and 11g showing two parallel processes 12f and 12g. When this DIDL 10c is read out into the compiler 2, parallel processes 12f and 12g include a shared process, and therefore in step 32, a shared circuit configuration 17c is generated for the shared part. That is, as shown in FIG. 8(b), the parallel processing 12g in the DIDL 10c is optimized to the parallel process 12g'.

The parallel process 12g' that carries out the processing for difference (i.e., not shared processing) is recognized as the first parallel processing that includes a data input into which output data "a" of the other parallel process 12f is inputted and a data input into which data "d" that does not pass via the other parallel process 12f is inputted. Accordingly, the operation element 55c included in the circuit configuration that carries out parallel process 12g' has an input into which the variable "a" is supplied and an input into which the variable "d" is supplied. The variable "a" is a variable that is delayed by a number of processing cycles of the operation element 55c compared to the variables "b" and "c" inputted into the matrix unit 51. The variable "d" is a variable inputted into the matrix 51 at the same time as the variables "b" and "c". For this reason, in step 33, to adjust the latency of variable "a" and variable "d" inputted into the element 55c that performs the parallel process 12g', a delay element 55d that delays the variable "d" inputted into the matrix unit 51 by a number of cycles of the operation element 55c that performs the parallel process 12f is inserted.

The number of cycles consumed when an addition is carried out by the operation element 55c is stored in the hardware library 3. In this case, in step 33, based on information stored in the hardware library 3, the delay element 55d that consumes an equivalent number of cycles to the number of cycles consumed by the element used for the addition is added to the DDDL 4. As a result, the DDDL 4 is generated so as to include hardware configuration information including the circuit configuration 18c shown in FIG. 8(c) and is outputted from the compiler 2 in step 34. It should be noted that to simplify the explanation hereafter, unless noted otherwise, the case where elements perform processing in one cycle is described.

Figure 9:
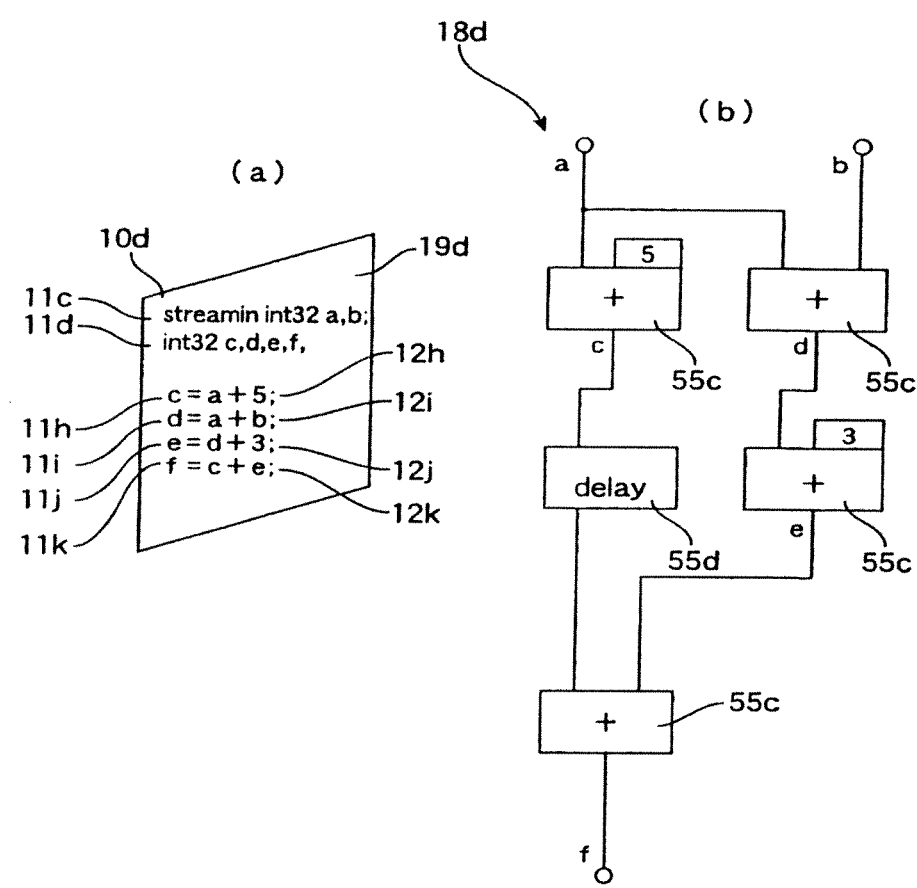
FIG. 9(a) shows yet another example of DIDL.
FIG. 9(b) shows a circuit configuration corresponding to the DIDL.

FIG. 9(a) shows yet another example of DIDL. This DIDL 10d includes, in addition to descriptions 11c and 11d relating to variables, parallel descriptions 11h to 11k indicating four parallel processes 12h to 12k. When the DIDL 10c is read out into the compiler 2, first, in step 32 that generates a circuit configuration, a circuit configuration for executing the parallel processes 12h to 12k is generated using the operation elements 55c. One variable "c" inputted into the parallel process 12k is the output of the parallel process 12h that has a variable "a" (hereinafter, "system input variable") inputted into the matrix 51 as an input. The other variable "e" inputted into the parallel process 12k is an output of a parallel process 12j to which an output of a parallel process 12i is inputted, and to the parallel process 12i, the system input variables "a" and "b" are inputted. Accordingly, in the step 33 that adjusts the latency, to adjust the latency of the variable "c" and the variable "e" inputted into the parallel process 12k, a delay element 55d for delaying the variable "c" relative to the variable "e" is added to supply the variable "c" to a data input of the element 55c for performing the final addition. As a result, the circuit configuration 18d shown in FIG. 9(b) is generated and is outputted from the compiler 2 as hardware configuration information for connecting a plurality of elements 55, that is, the DDDL 4.

When the descriptions in FIG. 9(a) are thought of as statements of a program 19d, the processes 12h to 12k are carried out in order from the top in accordance with the time axis. Accordingly, the variable "c" and the variable "e" subjected to the operation in the process 12k are respectively determined by the processes 12h and 12j carried out beforehand. When the descriptions in FIG. 9(a) are thought of as simply describing a plurality of processes executed in parallel, the variable "c" and the variable "e" used in the parallel process 12k will be values that were determined in the immediately preceding cycle, and therefore the output of the process 12k will differ to the case where the description is thought of as the program 19d. When the descriptions in FIG. 9(a) are thought of as descriptions of a definition file included in the present invention, that is, the DIDL 10d, the variable "c" and variable "e" used in the parallel process 12k are interpreted as having the same latency. Accordingly, the variable "c" that is decided two cycles earlier is delayed by the delay element 55d and synchronized with the variable "e" that is decided one cycle earlier to input into the parallel process 12k. As a result, three cycles after input of the variables "a" and "b", the output "f" of the parallel process 12k is consistent with that of the program 19d, so that the DIDL 10d that describes the parallel processing obtains the same result as the program 19d.

With the DIDL 10d that describes parallel processes, the processing content is the same even if the order of the descriptions 11h to 11k included in the DIDL 10d is changed. On the other hand, since the program 19d defines an algorithm with an order in which processes are aligned, that is, a time series or a time sequence, the processing content will differ if the statements are interchanged. However, by introducing a definition whereby the latency of the input variables is the same for a plurality of parallel descriptions, a file written as a program can be understood as a file that defines parallel processing, that is, a file that defines hardware. As a result, by writing a program showing an algorithm in accordance with a time series as normal, a programmer can produce a definition file included in the present invention that describes the hardware of a parallel processing system. Accordingly, by using DIDL (the definition file) it is possible for a programmer to design hardware with the same feeling as when producing a program.

In addition, in a definition file, the latency of variables inputted into a parallel process is merely understood as being the same, with there being no premise of specific hardware. "Input variables with the same latency" are either variables included in a data group loaded together into the system (in the present embodiment, the matrix 51) at the same timing (in synchronization) or are variables that are produced by the other parallel process that process data in the data group loaded together in synchronization, and therefore, except that variables are that originate with the variables inputted into the system synchronously, the premise of specific hardware for designing actual hardware is not required. Accordingly, the definition file included in the present invention can even be called a file being described by a hardware description language that does not depend on hardware. That is, it is possible to interpret the definition file regardless of the hardware used as a premise, and if the hardware is specified, it is possible to lay out the algorithm described by the definition on such hardware. Accordingly, a definition file such as the DIDL of the present embodiment can be said to be capable of expanding an algorithm not temporally but spatially. This means that by using the DIDL, an algorithm that can be described by a program can be executed by a plurality of elements, such as the elements 55 in the present embodiment, that operate in parallel, and therefore DIDL is a description of a hardware configuration used for executing.

FIG. 10 shows yet another example of DIDL. In this DIDL 10e, a process for finding a largest input variable "in" out of a predetermined number "num0fData" provided from the outside (periphery) is described. A part that follows a description 11l that sets an initial value describes parallel processing, and includes a parallel description 11m for a parallel process 12m that compares an input variable "in" with the highest value "a" so far and if so, sets the input variable "in" in the highest value "a", a parallel description 11n for a parallel process 12n that advances a counter, and a parallel description 11*o* for a parallel process 12*o* that outputs the highest value "a" set by the process 12*m* when the value counted in the process 12*n* has reached the predetermined number "numOfData". In the process 12*o*, to absorb the difference in cycles required by the above processes 12*m* and 12*n*, delay elements are inserted to adjust the latency of the variables supplied to the two data inputs.

Figure 11:
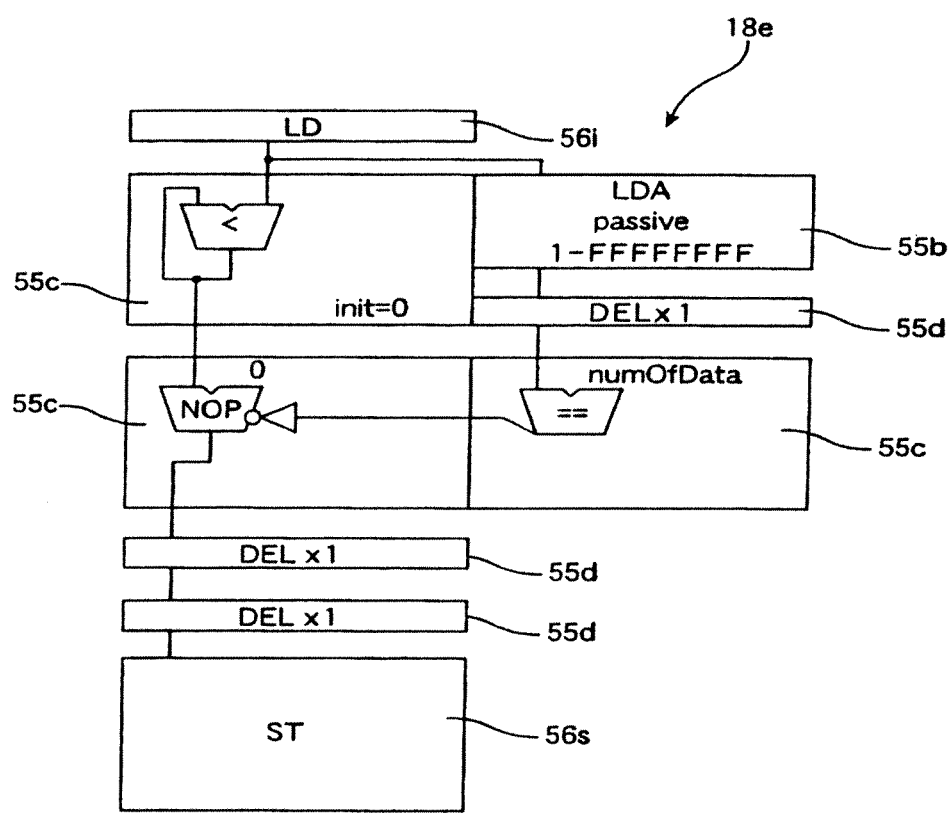
FIG. 11 shows a circuit configuration corresponding to the DIDL shown in FIG. 10.

FIG. 11 schematically shows a hardware configuration 18*e* produced by compiling the DIDL 10*e*. In step 32 that generates the circuit configuration, the parallel process 12*m* configures a circuit using an operation element 55*c*, the parallel process 12*n* configures a circuit using an address-generating element 55*b*, and the parallel process 12*o* configures a circuit using two operation elements 55*c*, thereby generating the DDDL 4 that shows the circuit configuration. The number of cycles consumed by the operation element 55*c* that performs the process 12*m* is larger than the number of cycles consumed by the element 55*b* that performs the counting process 12*n*. A delay element 55*d* is added to the side of the parallel process 12*o* that inputs the counter value. By doing so, data supplied to the data inputs of the parallel process 12*o*, that is, the latency of the output of the process 12*m* and the output of the process 12*n* is adjusted. It should be noted that the matrix unit 51 is divided into three segments and the circuits for the processes 12*m* to 12*o* are configured in the first segment, and therefore the two delay elements 55*d* disposed on the output side of the process 12*o* pass the data through the other segments and transfer the data to the output element 56*s*.

Figure 12:
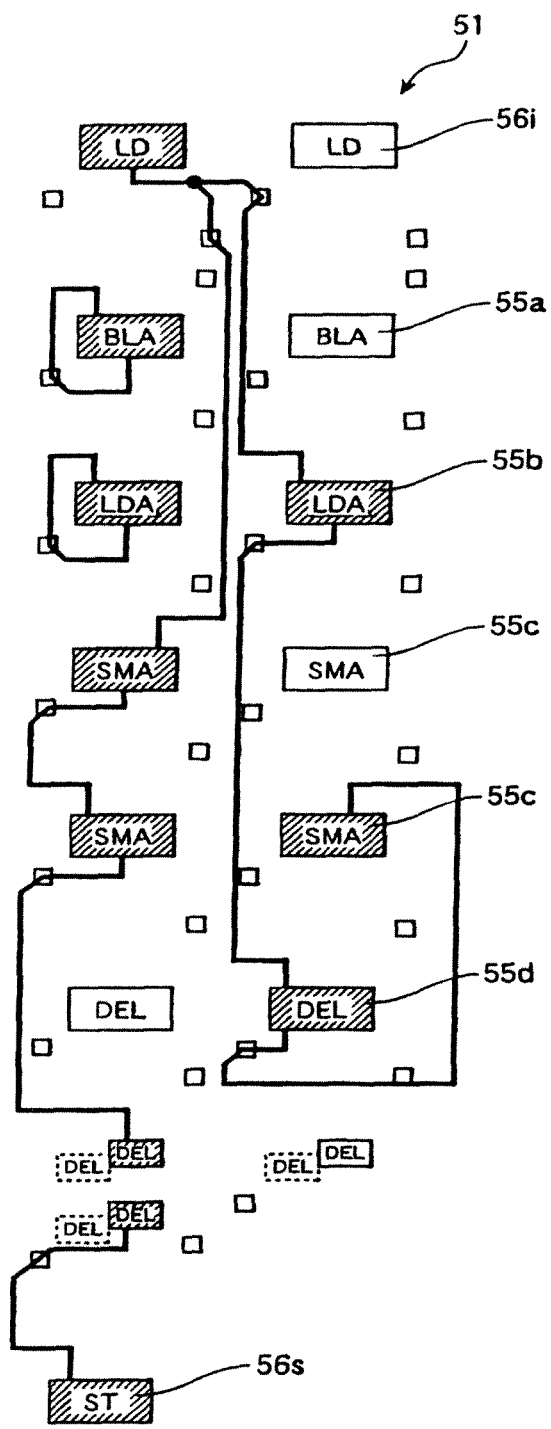
FIG. 12 shows a state where the circuit configuration shown in FIG. 11 is mapped in a matrix unit.

FIG. 12 shows a state where the circuit configuration shown in FIG. 11 has been laid out on the elements 55 disposed in the matrix unit 51 shown in FIG. 3. In the present embodiment, the algorithm of the DIDL 10*e* is mapped in the matrix unit 51 of the reconfigurable processor 20 where the elements 55 are disposed in a matrix in advance. As the information on the hardware configuration shown in FIG. 11, an arrangement of the selected elements and information on the wiring route that connects the selected elements, as shown in FIG. 12, are generated by the compiler 2 and outputted as the DDDL 4. It should be noted that the elements 55*a* and 55*b* that generate an address are used to input/be input variable "in" from the outside. Although not shown, the elements 55*g* and 55*h* that generate output addresses are used in the same way.

The parallel processing system 20 of the present embodiment is a reconfigurable processor (an integrated circuit apparatus) in which the elements 55 are disposed in a matrix, and as described above, the respective elements 55 include operation functions of a certain scale such as an ALU, and therefore a scale where one parallel process can be substantially carried out by one element is used. In addition, the respective elements 55 are operation units that are suited to specific or dedicated processing of data in byte or word units, such as 8, 16, or 32 bits. The input data and output data are latched using a flip-flop or the like and synchronized using a clock signal. That is, inputs and outputs for the respective elements 55 are synchronized using a clock. Accordingly, the number of cycles consumed by the respective elements 55 can be estimated in advance. In addition, since the respective elements are provided with operation functions with a certain scale suited to executing specific processing, it is possible to configure a circuit by assigning the parallel processes described by the DIDL 1 to hardware in units of elements. Accordingly, the number of cycles consumed by parallel processing can be easily estimated by interpreting the DIDL 1 with a premise of mapping to the matrix unit 51 as the parallel processing system, which makes it easy to generate a circuit configuration and also easy to adjust the latency. For this reason, the RP 20 that is a data processing apparatus equipped with the matrix unit 51, in which one parallel process can be substantially executed in units of elements that have a certain scale of processing performance, can be said to be an architecture suited to forming hardware from the definition file.

Also, since the parallel processing is laid out in units of the elements 55 and the number of cycles is managed, even if the function of a certain element 55 is changed by an input from the periphery while the application defined by the DIDL 1 is being executed, the application can still be executed without having an unpredictable effect on the other parallel processes. If the number of cycles fluctuates for an element 55 when the function changes, a delay element 55*d* can be connected to deal with this situation, with the number of cycles inside the delay element 55*d* being changed in the same way according to an input from the periphery so that the timing of a specified element 55 can be dynamically changed without having an effect on the data flow formed by other elements 55.

Figure 13:
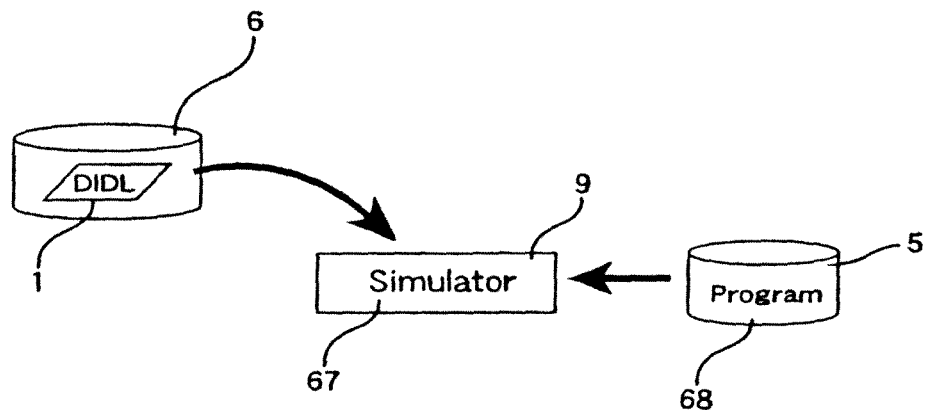
FIG. 13 shows an overall arrangement that simulates at a DIDL level.

FIG. 13 shows a simulator 67 for the DIDL level simulation. This simulator 67 is configured by installing a simulator program 68 on a general-purpose computer 9. A program or program product 68 for having a computer 9 simulate a system equipped with a plurality of types of elements that operate in parallel based on the DIDL 1 that is a definition file included in the present invention can also be provided by recording on a suitable recording medium such as a CD-ROM or provided via a computer network.

Figure 14:
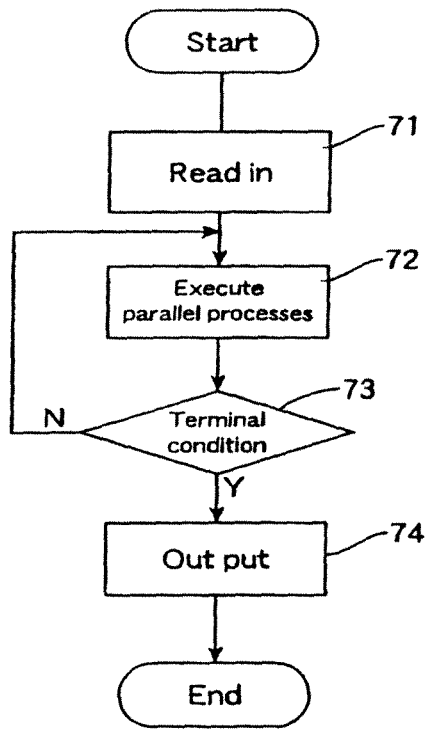
FIG. 14 is a flowchart schematically showing the processing of a simulator at the DIDL level.

FIG. 14 is a flowchart schematically showing the operation of the simulator 67. First, in step 71, the DIDL 1 is read out. Next, in step 72, the plurality of parallel processes described in the DIDL 1 are executed in synchronization. At this time, for the first parallel process that is shown by a first parallel description and has a plurality of data inputs, data with the same latency from input into the system are inputted into the plurality of data inputs. For example, data with the same latency as data (system input variables) that is inputted into the system and is defined as data that is not processed by other parallel processes is used. When terminal conditions, for example, conditions such as a predetermined number of iterations for which the parallel processing is repeatedly executed, or whether a result of the parallel processing described in the DIDL 1 has reached a predetermined value, are satisfied in step 73, the result of the simulation is outputted in step 74. By these steps, it is possible to simulate the operation of the hardware described by the DIDL 1 without depending on the hardware.

As described above, the present invention proposes a definition file including a plurality of parallel descriptions that respectively define a plurality of parallel processes performed independently in synchronization, and in the parallel descriptions that have a plurality of data inputs, data with the same latency from input into the system is interpreted as being supplied to the plurality of data inputs. Parallel processes are described in the definition file that describes parallel processes can be understood to be a hardware description file, and since the hardware itself does not appear, the definition file can be understood a hardware description with no hardware dependency. In addition, since the definition file includes parallel descriptions, it is possible to define an algorithm in a state where a program counter is not necessary.

The definition file included in the present invention contains descriptions that are somewhat similar to conventional high-level language but are parallel descriptions that have no time order, it is possible to describe the order included in the algorithm spatially and not temporally, and therefore it is possible to easily and quickly form a parallel processing system including a plurality of elements that operate in parallel. The definition file included in the present invention is especially useful when designing and developing a parallel processing system where operation units with a certain degree of operation functioning, such as ALUs, are disposed in a matrix, and also a reconfigurable data processing system where the connections between operation units are changed.

The invention claimed is:

1. A method for forming, in accordance with a definition file, a parallel processing system that includes a plurality of types of elements that operate in parallel, the method comprising:
    a first step of reading in the definition file, the definition file including a plurality of parallel descriptions that respectively define a plurality of parallel processes performed independently, the plurality of parallel descriptions including a first parallel description showing a first parallel process with a plurality of data inputs including at least one data input into which output data of another parallel process is inputted;
    a second step of generating, based on a hardware library in which information about the plurality of types of elements is stored, hardware configuration information including circuit configurations that execute the plurality of parallel processes defined by the plurality of parallel descriptions of the definition file and storing the hardware configuration information in a memory, the circuit configurations including at least one of the plurality of types of elements and each of the plurality of parallel processes being executed synchronously to each other and independently of orders defined by the plurality of parallel descriptions of the definition file;
    a third step of adding delay elements to the hardware configuration information stored in the memory so that data with a same latency from input into the parallel processing system are inputted into a plurality of data inputs of a circuit configuration that execute the first parallel process; and
    a fourth step of outputting the hardware configuration information stored in the memory.

2. The method for forming according to claim 1, wherein the parallel processing system is reconfigurable to different hardware configurations by changing connections between the plurality of types of elements and the hardware configuration information includes information showing a plurality of different hardware configurations.

3. The method for forming according to claim 1, wherein the plurality of types of elements include a plurality of types of operation units of a scale whereby one operation unit is capable of processing parallel process defined by one parallel description of the definition file.

4. The method for forming according to claim 1, wherein the plurality of types of elements include a plurality of types of operation units that execute different operations in byte or word units.

5. The method for forming according to claim 1, wherein information on a number of cycles consumed by respective types of elements is stored in the hardware library, and
    in the third step, a delay element corresponding to a number of cycles consumed by at least one of the plurality of types of elements is added.

6. The method for forming according to claim 1, wherein the plurality of parallel descriptions include a second parallel description that defines a second parallel process including shared processing that is common to at least part of a third parallel process defined by a third parallel description,
    in the second step, a shared circuit configuration including at least one of the plurality of types of elements is generated for the shared processing, and
    in the third step, a delay element is added to a circuit configuration that execute a difference between the second parallel process and the shared processing as the circuit configuration that execute the first parallel process.

7. An apparatus that forms, in accordance with a definition file, a parallel processing system that includes a plurality of types of elements that operate in parallel, the apparatus comprising:
    a processor;
    a memory;
    a hardware library that stores information about the plurality of types of elements;
    an inputting unit that reads in the definition file, the definition file including a plurality of parallel descriptions that respectively define a plurality of parallel processes performed independently, the plurality of parallel descriptions including a first parallel description showing a first parallel process with a plurality of data inputs including at least one data input into which output data of another parallel process is inputted;
    a generating unit that generates, based on the hardware library, hardware configuration information including circuit configurations that execute the plurality of parallel processes defined by the plurality of parallel descriptions of the definition file and stores the hardware configuration information in the memory, the circuit configurations including at least one of the plurality of types of elements and each of the plurality of parallel processes being executed synchronously to each other and independently of orders defined by the plurality of parallel descriptions of the definition file;
    an adding unit that adds delay elements to the hardware configuration information stored in the memory so that data with a same latency from input into the parallel processing system are inputted into a plurality of data inputs of a circuit configuration that execute the first parallel process; and
    an outputting unit that outputs the hardware configuration information stored in the memory.

8. The apparatus according to claim 7, wherein the parallel processing system is reconfigurable to different hardware configurations by changing connections between the plurality of types of elements and the hardware configuration information includes information showing a plurality of different hardware configurations.

9. A program product stored on a non-transitory computer-readable recording medium for causing a computer to execute a process for designing, in accordance with a definition file, a parallel processing system that includes a plurality of types of elements that operate in parallel, the process comprising:
    a first step of reading in the definition file, the definition file including a plurality of parallel descriptions that respectively define a plurality of parallel processes performed independently, the plurality of parallel descriptions including a first parallel description showing a first parallel process with a plurality of data inputs including at least one data input into which output data of another parallel process is inputted;
    a second step of generating, based on a hardware library in which information about the plurality of types of elements is stored, hardware configuration information including circuit configurations that execute the plurality of parallel processes defined by the plurality of parallel descriptions of the definition file and storing the hardware configuration information in a memory, the circuit configurations including at least one of the plurality of types of elements and each of the plurality of parallel processes being executed synchronously to each other and independently of orders defined by the plurality of parallel descriptions of the definition file;

a third step of adding delay elements to the hardware configuration information stored in the memory so that data with a same latency from input into the parallel processing system are inputted into a plurality of data inputs of a circuit configuration that execute the first parallel process; and a fourth step of outputting the hardware configuration information stored in the memory.

* * * * *